United States Patent [19]
Whitley et al.

[11] Patent Number: 4,520,549
[45] Date of Patent: Jun. 4, 1985

[54] MULTIPLE COMPONENT LEAD PROCESSING APPARATUS

[75] Inventors: George J. Whitley, Philadelphia, Pa.; Martin Rayl, Lawrenceville; William Squire, Livingston, both of N.J.

[73] Assignee: RCA Corporation, Princeton, N.J.

[21] Appl. No.: 363,960

[22] Filed: Mar. 31, 1982

[51] Int. Cl.³ .................. B23P 19/00; H05K 3/30
[52] U.S. Cl. ..................... 29/566.3; 29/739; 29/838; 74/109; 74/66 SF; 83/200; 140/105
[58] Field of Search .............. 29/33 M, 564.1, 566.3, 29/566.4, 739, 741, 759, 760, 831, 832, 835, 837, 838; 83/199, 200, 580; 140/1, 93 D, 105; 74/105, 107, 109, 471, 66 SF

[56] References Cited
U.S. PATENT DOCUMENTS 1,517,525 12/1924 Ault .................................... 74/110 X
2,878,331 3/1959 Ejellstedt ........................... 74/471 X
3,813,951 6/1974 Zagar ..................................... 408/47
4,377,026 3/1983 Whitley .............................. 29/564.1

FOREIGN PATENT DOCUMENTS 1350924 4/1974 United Kingdom .
0706947 12/1979 U.S.S.R. ............................. 29/566.3

Primary Examiner—Z. R. Bilinsky
Attorney, Agent, or Firm—Joseph S. Tripoli; Robert L. Troike; Raymond E. Smiley

[57] ABSTRACT

A plurality of component lead processing assemblies are located in a plane each releasably secured to a different given location on a support structure. Each processing assembly has an anvil and a lead processing part which is rotatable relative to the anvil for performing the lead processing on leads of components secured to a printed circuit board. A link structure is coupled to each lead processing part movable in a direction parallel to the plane of the processing assemblies for concurrently rotating the processing parts in response to the actuation of drive means.

18 Claims, 8 Drawing Figures

MULTIPLE COMPONENT LEAD PROCESSING APPARATUS

This invention relates to apparatus for cutting and clinching the leads of a component on a printed circuit board and more particularly to apparatus capable of concurrently cutting and clinching the leads of more than one component.

Apparatus exists for cutting and clinching leads of a component on a printed circuit board. The term "clinch" refers to the bending of component leads to lie generally parallel to the printed circuit board for the purposes of preventing the components from falling out of the board until such time as they are secured to the board by soldering in a subsequent manufacturing step. Such apparatus as illustrated and described in copending U.S. patent application Ser. No. 075,585 filed Sept. 14, 1979 comprises a cut and clinch head assembly including a rotatable member for cutting the component leads and clinching them to the printed circuit board and further comprises an air operated solenoid for rotating the member and two air hoses for supplying control air to the air cylinder. The air cylinder and air hoses occupy a volume many times that of the cutting and clinching head assembly. In practice, six to twelve or even more such cutting and clinching assemblies are adjacent the printed circuit board for simultaneously cutting and clinching the leads of a like number of components. Because of the relatively large size of the air cylinder and attached hoses in some applications, it is difficult to position such apparatus where desired because of the physical interference of one apparatus with another. Further, if it is thereafter desired to move one apparatus the physical size of the air cylinders make the task, at best, difficult.

British Pat. No. 1,350,924 published Apr. 24, 1974 describes an apparatus for performing cutting and flattening of a plurality of component leads at one time. The British apparatus requires considerably more distance from the printed circuit board to the bottom of the apparatus than does the system of the instant invention. This may interfere with the operator whose legs may be beneath the cut and clinch apparatus as described in the above-mentioned application. Further, the various cut and flatten assemblies are urged open by a spring mechanism. The spring mechanism, due to its resiliency, could fail to perform its function if debris such as the cutoff portions of component leads get caught in the mechanism.

In accordance with one embodiment of the invention a support structure includes means for receiving a plurality of lead processing assemblies lying in a plane. Each processing assembly comprises an anvil secured to the support structure and a lead processing means rotatable relative thereto for processing the leads of a component on a printed circuit board adjacent the support structure. A link means coupled to each lead processing means includes at least one link which is movable relative to the support structure in a direction parallel to the plane for rotating the processing means as the link means is moved. A drive means moves the link means relative to the support structure to concurrently rotate the cutters of said heads whereby the component leads are cut and bent.

Figure 1:
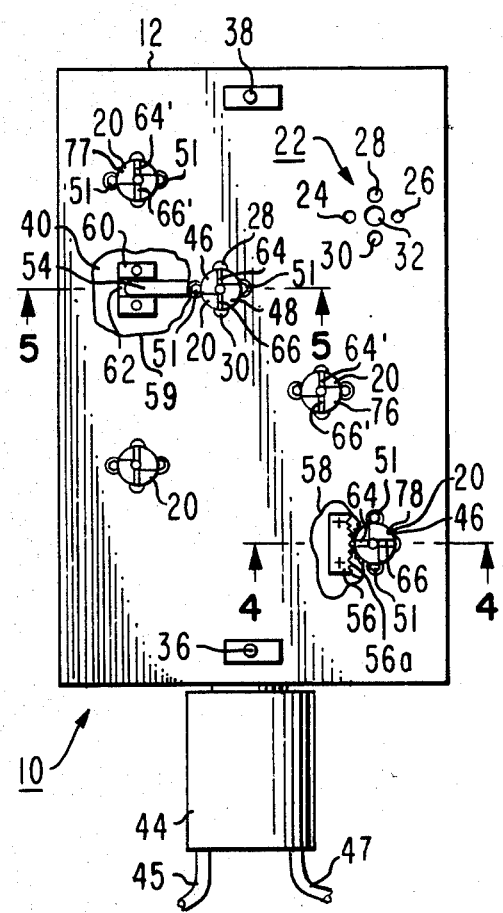
FIGS. 1 and 2 are plan and and elevation views, respectively, of a component lead cut and clinch apparatus in accordance with one embodiment of the invention.
Figure 2:
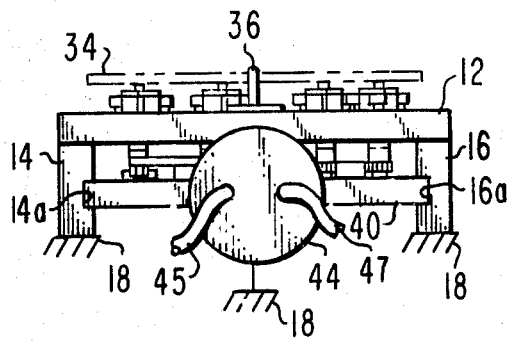
Figure 4:
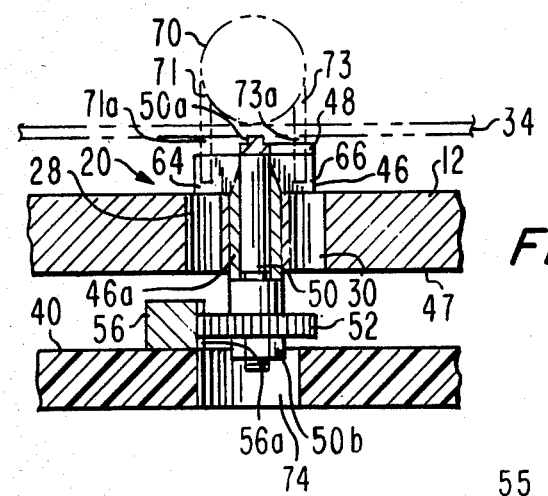
FIG. 4 is a sectional view along lines 4—4 of FIG. 1 illustrating one embodiment of a cut and clinch head assembly for rotating the cutter and lead bending element.
Figure 5:
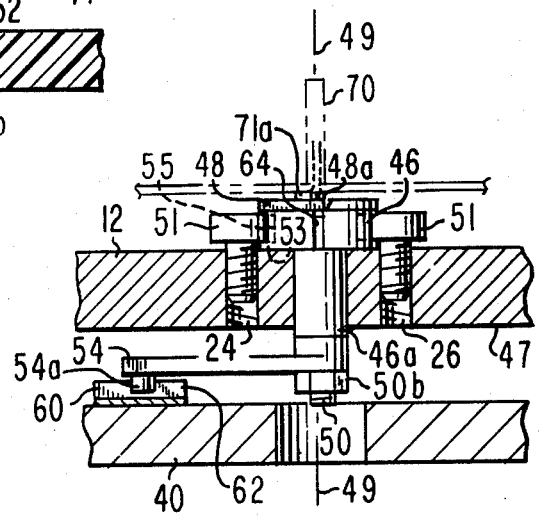
FIG. 5 is a sectional view along lines 5—5 of FIG. 1 illustrating a second embodiment of a cut and clinch head assembly for rotating the cutter and lead bending element.

With reference to FIGS. 1 and 2 a multiple component cut and clinch system generally indicated at 10 includes a support structure comprising a plate 12 and two frame and guide members 14 and 16 to which the plate 12 is secured. Plate 12 is shown partially broken away in FIG. 1 to illustrate details to be hereinafter described. As represented by the symbols 18, FIG. 2, frame members 14 and 16 are secured to stationary structural members (not shown) such as conveyor belt supporting structure in a factory assembly line. At least one, but typically a plurality of component lead cut and clinch head assemblies 20, to be described in more detail hereinafter in connection with the description of FIGS. 4 and 5, are secured to plate 12. Five such head assemblies are illustrated in FIG. 1.

In region 22 of plate 12 (FIG. 1) are apertures in the plate for accepting a sixth head assembly. Apertures 24 and 26 are threaded to accept screws to secure a head assembly 20 in place. Apertures 28 and 30 allow cutoff wires from electrical components (such as component 70 illustrated in phantom in FIG. 4) to fall through plate 12. A portion of head assembly 20 is in aperture 32. Apertures similar to apertures 24, 26, 28, 30 and 32 are located in plate 12 for each head 20 assembly. The head assemblies are positioned on plate 12 at locations determined by the location on printed circuit board 34 (illustrated in phantom in FIG. 4) of components whose wire leads are to be cut and then clinched to the printed circuit board. The printed circuit board 34 (FIG. 4) is positioned relative to plate 12, FIG. 1, by locating pins 36, 38 which are secured to plate 12. Printed circuit board 34 has matching locating apertures.

A moveable plate 40 (FIGS. 2 and 3) slides in frame 14 and 16 guide slots 14a and 16a parallel to and spaced from plate 12. For each cut and clinch head assembly 20 there is a corresponding oval shaped aperture such as 74 in plate 40 (see FIG. 3) in line with each head assembly for permitting the passage therethrough of the cut portions of the leads by gravity. Motion of plate 40 is in the directions 42, FIG. 3, parallel to the plane of plates 12 and 40. Air cylinder 44, which is mechanically secured to the structure to which frames 14 and 16 are secured, moves plate 40 via link 41. Air cylinder 44 is air operated in response to pressurized air supplied in one or the other of hoses 45, 47. While an air cylinder is shown, other power devices may be employed in the alternative. Link 41 is connected to the air cylinder 44 piston and is moved in one of directions 42, FIG. 3, depending on which of hoses 45, 47 is supplied the pressurized air. The purpose of plate 40 is to impart simultaneous rotary motion to the cutting parts of head assemblies 20 in a manner best understood by reference to FIGS. 4 and 5 to which attention is now directed.

The cut and clinch head assembly 20 comprises two elements. One element is a fixed flat surfaced cylindrical anvil 46 with a smaller diameter cylindrical shaft 46a passing through and depending from the plate 12 lower surface 47. The second element is a rotatable cutter 48 and its shaft 50 depending from and integral with cutter 48. Shaft 50 passes through and beneath surface 47 of plate 12. The lower end of shaft 50 is threaded to receive a nut 50b. A projection 50a is integral with and projects above cutter 48. Anvil 46 is secured to plate 12 by screws 51 (FIG. 5). Anvil 46 is prevented from rotating with respect to plate 12 by screws 51 whose heads are closely received in corresponding grooves 55 (FIG. 5) in the anvil. Each screw 51 head rests against an anvil shoulder 53 and clamps the anvil to plate 12.

Each anvil 46 includes a plurality of slots such as slots 64 and 66 equal in number to the number of leads on a component to be cut and clinched, two slots being shown by way of example. As illustrated in FIGS. 1 and 4, anvil 46 has two opposed slots 64, 66 into which leads 71, 73 (broken lines) of an electronic component (such as 70 shown in phantom, FIG. 4) are positioned preparatory to the cutting and clinching steps. The leads 71, 73 pass through corresponding apertures in printed circuit board 34. The printed circuit board is aligned relative to plate 12 by pins 36 and 38, FIG. 1. This aligns the printed circuit board components apertures (not shown) relative to slots 64 and 66. When the leads of component 70 (FIG. 4) are passed through the appropriate component apertures in the printed circuit board 34, the leads automatically are aligned with and positioned in slots 64 and 66. The slots 64, 66 are aligned with corresponding apertures in plate 12, such as 28 and 30, FIG. 1, permitting the cutoff portion of leads to pass through slots 64, 66, apertures 28 and 30 and thus through plate 12.

Cutter 48 has a thickness sufficient to clinch a cut lead against the lower surface of the printed circuit board when cutter 48 is rotated about axis 49. The cutter edge at 48a, FIG. 5, is tapered and acts as a wedge when rotated to cut and bend the adjacent lead of component 70.

Figure 3:
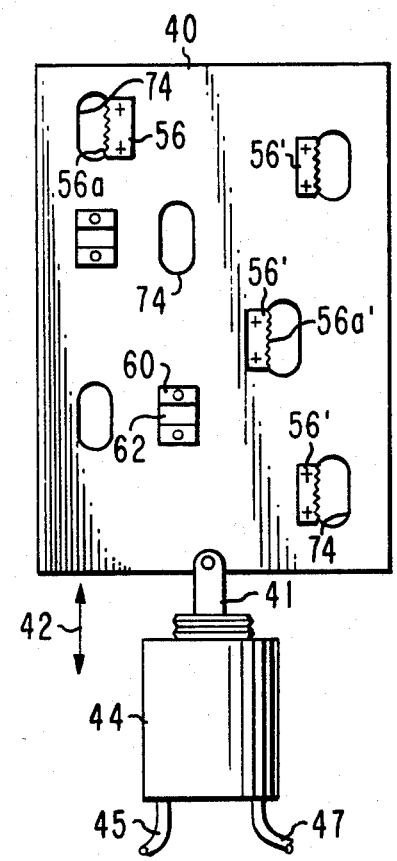
FIG. 3 is a plan view of a part of the apparatus of FIG. 1.

A link means to rotate shaft 50 and the attached cutter 48 about axis 49, relative to anvil 46 comprises plate 40, FIG. 3, and alternative cutter operating elements illustrated in FIGS. 4 and 5. In FIG. 4, one cutter operating element includes a pinion 52 secured to shaft 50 by nut 50b threaded to shaft 50. Pinion 52 abuts shaft 46a. Pinion 52 engages the teeth 56a of rack 56 secured to plate 40. The teeth 56a of rack 56 are aligned parallel to the directions 42 of movement of plate 40 (see broken away portion 58, FIG. 1). The rack teeth 56a are over opening 74 in plate 40. Thus, as plate 40 moves in one direction 42, FIG. 3, pinion 52 in engagement with rack 56 rotates, rotating shaft 50 and thereby cutter 48.

In FIG. 5, an alternative operating element includes a lever arm 54 secured at one end to shaft 50 and a slotted bracket 60 secured to plate 40 illustrated in section. Bracket 60 has a slot 62, FIG. 1, and is secured to plate 40 with the slot 62 (see FIG. 1, broken out portion 59) normal to the directions 42. A stud 54a, which depends from the other end of arm 54 slides in slot 62. Thus, as plate 40 is moved back and forth in directions 42, (FIG. 3), the motion moves stud 54a in directions 42 pivoting arm 54 about the axis of rotation 49 of shaft 50 rotating cutter 48 relative to stationary anvil 46. The selection of a given rotating mechanism is a matter of preference. Typically, however, only one type would be used in a particular implementation.

Head assemblies 20 are secured to plate 12 with the cutter 48 edges 48a and anvil 46 slots 64, 66 aligned with the orientation of the corresponding component apertures of the printed circuit board 34. Thus, by way of example, the slots 64', 66' in anvil 76 (FIG. 1) or anvil 77 are oriented parallel to the direction of travel of plate 40 while the slots 64, 66 in anvil 46 of assembly 78 (FIG. 1) are oriented normal to directions 42. Other intermediate orientations are possible.

In assembly, plate 40 can be positioned relative to plate 12 fully extended away from air cylinder 44 or fully retracted toward air cylinder 44 by link 41. Then each cutter 48 and arm 54, FIG. 5, or pinion 52 (FIG. 4) are oriented such that the cutting edges 48a, FIG. 5, of cutters 48 are just clear of the corresponding component lead slot 64. Cutting edges identical to edges 48a of cutters 48 are positioned just clear of the corresponding slots 66. As cutters 48 are rotated, their cutting edges 48a pass over corresponding slots 64, 66. The assemblies 20 all lie in a plane parallel to the direction of movement of plate 40.

Operation of the cutting and clinching assemblies of FIGS. 1, 2 and 3 is as follows. First, printed circuit board 34 is positioned over locating pins 36, 38. Then the printed circuit board alignment holes (not shown) and pins 36, 38 are engaged aligning certain of the board component apertures with corresponding cut and clinch assemblies 20. At this time cutter 48 projections 50a abut the board 34 undersurface as shown in FIG. 4. Then the component leads of one or more components are inserted in the aligned component apertures in the printed circuit board and in slots 64, 66 adjacent cutter edges 48a. The components may be manually held against the board while the board abuts projections 50a. The insertion and holding may be done by an operator or by a mechanical means such as a robot. Air cylinder 44 is operated to move plate 40 in one of directions 42, such as away from air cylinder 44, and then in the opposite direction. As the plate 40 is moved in the one direction, all cutters 48 are rotated simultaneously to cut the component leads with the cutting edges 48a rotating across slots 64 and 66 and then, by continued rotation of cutters 48, clinching the depending parts 71a and 73a of leads 71, 73 (FIG. 4) against the underside of printed circuit board 34 (as illustrated in phantom in FIG. 5) with the tapered wedge surface of the cutters 48. The cutters are then returned to their initial position by air cylinder 44 via link 41, plate 40, racks 56, and pinions 42 (FIG. 4) or levers arms 54 and slotted brackets 60 (FIG. 1), by movement of plate 40 in the opposite direction. The printed circuit board now with a plurality of components firmly clinched thereto by means of their leads which have been trimmed to the desired length, is disengaged from pins 36, 38 (by manual or automatic means, not shown), passed to a subsequent stage of assembly and a new board positioned as previously described.

For many applications not requiring frequent change of component locations the multiple cut and clinch assembly of FIGS. 1, 2 and 3 is satisfactory. In other applications it may be desirable to easily alter the locations of the cut and clinch assemblies 20.

Figure 6:
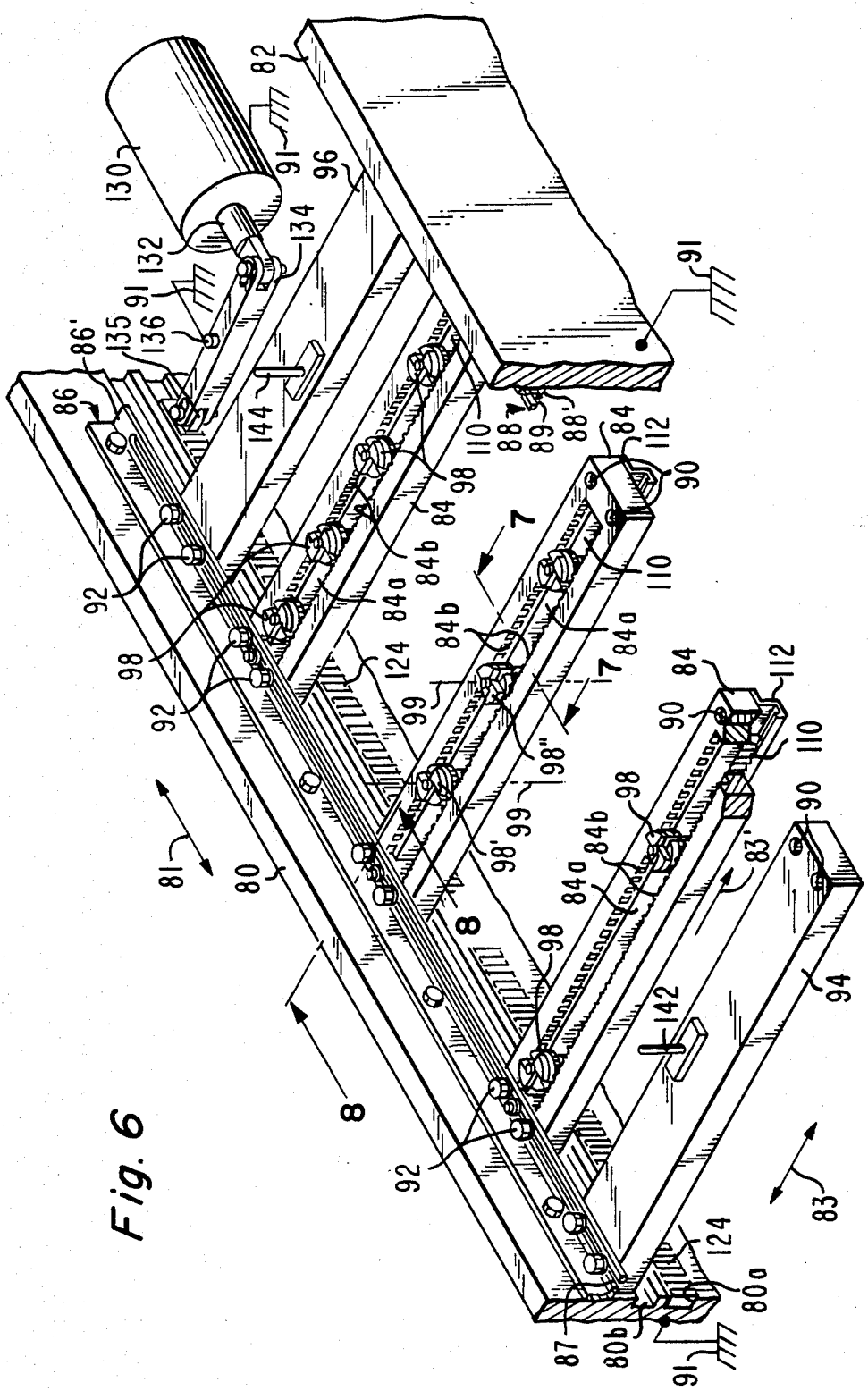
FIG. 6 is an isometric partially fragmented view of an alternative embodiment of a multiple component cut and clinch apparatus.

The apparatus of FIG. 6 to which attention is now directed permits location of cut and clinch assemblies 98, similar to assemblies 20, FIG. 1, to any location throughout a given printed circuit board area. The apparatus includes two parallel side rails 80, 82 mechanically secured to other support structures (not shown) represented by symbols 91. One or more cut and clinch head assembly 98 supports 84 (three being shown) are between and slidably secured to rails 80 and 82. The length dimension of supports 84 (parallel to directions 83) are normal to the length dimension of the rails (directions 81). The position of the supports 84 along rails 80 and 82 in directions 81 is determined by the locations in the printed circuit board (not shown) of components whose leads are to be cut and clinched by assemblies 98. The supports 84 contain two threaded apertures 90 at each end. The two apertures at the end adjacent rail 80 are covered by angle 86, leg 86'. Once the positions in directions 81 of assemblies 98 are determined, supports 84 are secured to slotted legs 86', 88', of angles 86, 88, respectively fixing the supports 84 in place. The other legs of angles 86, 88 are secured to rails 80 and 82, respectively, utilizing suitable fastening means. Screws 92 pass through the slots 87, 89 in respective angles 86, and 88 and are threaded to apertures 90 to lock the supports 84 in place. Two printed circuit board locating pins 142, 144 are secured to support structures 94, 96. Structures 94, 96 are appropriately positioned along rails 80 and 82 at any desired location in directions 81 and secured to legs 86', 88' in the same manner as are supports 84.

Figure 7:
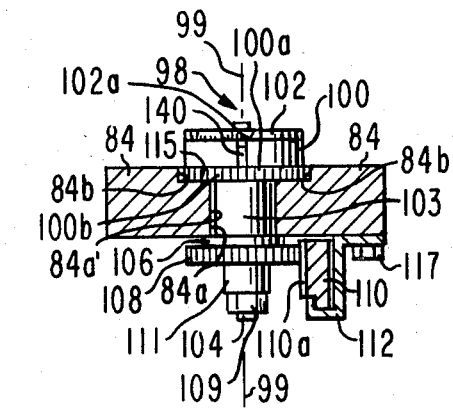
FIG. 7 is a sectional view along lines 7—7 of FIG. 6 of a single cut and clinch head subassembly.

Each support 84, FIGS. 6 and 7, has a slot 84a extending the greater portion of its length in which one or more cut and clinch head assemblies 98 are positioned. Head assemblies 98 are substantially similar to head assemblies 20, FIGS. 1-4. Assemblies 98 differ from assemblies 20 in that assemblies 98 each have a splined flange 100a, FIG. 7, on the anvil 100. The splines 100b on flange 100a completely circumscribe the outer circular peripheral edge of flange 100a. The splines 100b are parallel to axis 99 about which cutter 102 and its attached shaft 104 rotate. Flange 100a is at the lower portion of anvil 100 and is washer-like in shape. Another difference from assembly 20 is that shaft portion 103 of anvil 100 terminates flush with the lower surface of support 84. Washer 106 is between and abuts support 84 and pinion 108. Nut 109 is threaded to shaft 104 to lock pinion 108 via hub 111 to a shoulder (not shown) on shaft 104. Pinion 108 is keyed to the shaft. The washer 106, through which shaft 104 passes, serves to space the teeth of pinion 108 from support 84. The combination of flange 100a, spacer 106, and pinion 108 cooperate to keep anvil 100 from coming out of slot 84a. The assembly comprising cutter 102, shaft 104, nut 109, and pinion 108 rotate about axis 99 with respect to support 84 and anvil 100 (and its shaft 103) which remain stationary.

The slot 84a is shown in more detail in FIG. 7. Slot 84a comprises a lower channel 84a' and an upper channel bearing splined side walls 84b. The splines 84b form a relatively wider channel than the side walls of channel 84a'. Thus, a pair of horizontal aligned shoulders 115 are between splines 84b and channel 84a. The flange 100a of anvil 100 rests on shoulders 115 which prevent movement of anvil 100 and cutter 102 toward the bottom of the drawing. The anvil splines 110b are dimensional to be closely received by the splines 84b of support 84. The splines 84b are parallel to axis 99 and prevent rotation of anvil 100 about axis 99. The splines 84b are dimensioned so that anvil 100 can be placed anywhere along support 84 in slot 84a to an accuracy set by the pitch of the grooves of the splines 84b or 100b. The smaller the pitch, the greater the accuracy, i.e., the smaller the increment of adjacent positions of the anvil 100.

Because the splines 100b on anvil 100 encircle the anvil, the anvil can be positioned in slot 84a in any angular orientation about axis 99 to an accuracy set by the pitch of the splines 100b. The smaller the pitch, the smaller the angular increments to which the anvil 100 can be set in place. As a result, the slots 140 on anvil 100 for receiving the leads of a component can be angularly positioned about axis 99 in alignment with any angular orientation (with respect to axis 99) of component leads (not shown) to be cut and clinched by assembly 98. Therefore, the cutters 102 and anvil slots 140 of the different assemblies 98 attached to the supports 84 may have different cutting orientations with respect to each other relative to their axes of rotation 99. This can be observed in FIG. 6, assemblies 98', 98", whose cutters are oriented 90° with respect to each other relative to their axes 99. At least the upper portion of slot 84a, FIG. 6, is splined as at 84b to accept the mating splines FIG. 6 of anvil 100, flange 100a. Anvil 100 is positioned on support 84 anywhere along slot 84a permitted by the splines 84b and angularly oriented about axis 99, FIG. 7, so that its cutting slots such as 140, FIG. 7, are aligned to the anticipated orientation of the component leads (not shown) to be cut and clinched by that assembly 98.

The anvil 100 is lowered into place in support 84 so that the respective splines 100b lock the anvil in a given orientation and position. Other anvils are also oriented and locked in place. A cutter 102 with attached shaft 104, which is similar to rotary cutter 48 and shaft 50, FIG. 4, is inserted into each anvil 100. A spacer washer 106 (FIG. 7) and a pinion 108 are attached to the shaft 104 thus locking the cutter assembly 98 to support 84. The pinion 108 prevents upward movement and anvil 100 prevents downward movement of assembly 98 in support 84.

A rack 100 and guide 112 extend the length of each support 84 along one side thereof. Guide 112 is secured to and beneath support 84 by screw 117, FIG. 7. Rack 110 is supported by guide 112 which may be formed from sheet metal and positioned with respect to support 84 such that the rack teeth 110a engage the teeth of each pinion 108 of each cut and clinch head assembly 98 in a support 84. Rack 110 moves back and forth in directions 83 (in and out of the page in FIG. 7) normal to directions 81 and when this occurs, by means to be described, each cutter 102 is rotated about axis 99 to perform the cut and clinch operation described in connection with the description of FIGS. 1-5.

Figure 8:
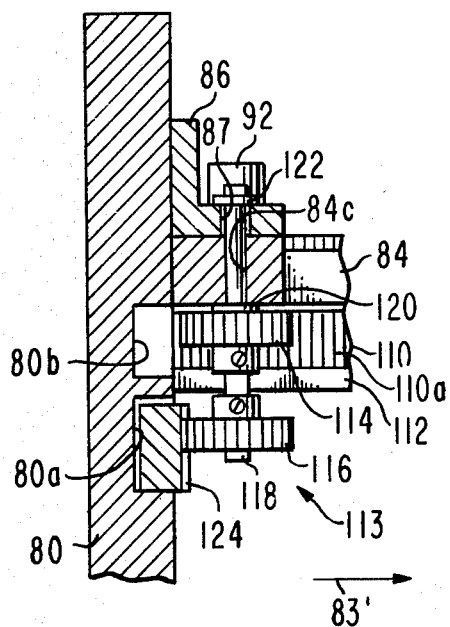
FIG. 8 is a sectional view along lines 8—8 of FIG. 6 illustrating a double pinion mechanism for effecting translation of motion from one rack to another.

Pinions 108, racks 110 with means best illustrated in FIG. 8 to which attention is now directed, comprise a link means between rotary cutters 102, FIG. 7, and a drive means to be hereinafter described for rotating cutters 102 in response to the action of the drive means. Pinion assembly 113 comprises two pinions, 114 and 116, secured in tandem to a common shaft 118. A spacing washer 120 is positioned above pinion 114. The shaft 118 passes through bearing opening 84c in one end of support 84 and in line with the slot 87 on angle 86. A C-ring 122 is positioned in a slot (not shown) in shaft 118 to hold shaft 118 in place relative to support 84 and rail 80 while permitting rotation of shaft 118.

A rack 124 reciprocates parallel to rail 80 (directions 81, FIG. 6) in a channel 80a in the rail by means to be described. Rack 124 is coupled at one end to a mechanism for creating longitudinal motion of the rack. The mechanism may comprise an air operated air cylinder 130 (FIG. 6) having a piston 132 coupled to one end of a link 134. The distal end of link 134 is pivotally coupled to an ear 135 connected to rack 124. The link 134 pivots about pin 136. Pin 136 and air cylinder 130 are mechanically secured to a stationary fixed structure (not shown, represented by symbols 91) which supports rails 80 and 82.

Assembly of the structure of FIG. 6 is as follows. First, the desired number of supports 84 each with a rack 110 and a rack support 112 in place are positioned along rails 80 and 82 in directions 81 and secured to angles 86, 88 by fasteners 92. The positions are determined by the location of components on a printed circuit board whose leads are to be cut and clinched. Then all racks 110 are moved to one end of their travel either against rail 82 or into rack 110 clearance slot 80b in rail 80. The latter position will be assumed for purposes of the description of operation which follows the assembly description.

Next, in succession, all anvils 100 and cutters 102 are positioned in the various supports 84 longitudinally along the supports in accordance with positions of components to be cut and clinched in the printed circuit board (not shown). In this respect, the anvils are rotationally positioned so their slots 140 (FIG. 7) are oriented in line with component leads to be cut and, when so oriented, the anvils 100 are inserted in the splines in support 84 until the spline flanges 100a rest against shoulders 115. The angular position of each cutter 102 is aligned relative to the corresponding slots 140 of anvil 100 such that the cutter edges 102a just clear slots 140 (FIG. 7). A spacer 106 and pinion 108 are then secured to each cutter 102 locking the assembly 98 to support 84. The position of the assemblies 98 can be independently set for each assembly in directions 83.

Alternatively, each of the cutter head assemblies 98 can first be positioned in support 84 as described above. Then the system with cutters can be positioned along rails 80 and 82. In either case, all head assemblies lie in a plane parallel to directions of movements of racks 110 and 124.

Next, piston 132 is retracted or extended. For purposes of description of operation which follows the description of assembly, piston 132 is assumed to be retracted such that rack 124 is positioned to its extreme left position in the drawing, FIG. 6. Then pinion assembly 113 (FIG. 8) for each support 84 is inserted into its respective aperture 84c in a corresponding support 84 and a C ring 122 snapped into place on shaft 118 to secure that assembly 113 to its support 84. The pinion 114 engages rack 110 and the pinion 116 engages rack 124.

In operation the printed circuit board is positioned over the various cutter assemblies 98 and positionally located by locating pins 142, 144 (FIG. 6). Then components are added above various ones of the cutting assemblies 98. Then air cylinder 130 is operated to extend piston 132 to the left in FIG. 6 which pivots link 134 about pin 136 and moves rack 124 from left to right, FIG. 6, which moves racks 110 via pinion assembly 113 left to right, direction 83', FIGS. 6 and 8. This action rotates cutters 102 of assemblies 98 clockwise, FIG. 6, to cut and bend the leads of their respective components, as described in more detail in connection with the description of FIGS. 1–5. Air cylinder 130 then retracts piston 132 which returns racks 124, 110, and movable cutters 102 via link 134 to their starting points, ready to cut and clinch the leads of components on a subsequent printed circuit board.

Retooling for different printed circuit boards or different component locations on a printed circuit board is a matter of relocating supports 84, in either direction of directions 81, as described, after temporarily removing pinion assemblies 113 (FIG. 8) and relocating and reorienting cutter assemblies 98, as necessary, by temporarily removing nut 109, FIG. 7, and spacers 106 and pinions 108.

With reference to the description of operation of FIGS. 1, 2, and 3, and of FIG. 6, it has been stated that after the electrical components are added to the printed circuit board, the described mechanism rotates all cutting and clinching assemblies at once. In some applications a single component or perhaps two components are first added to the printed circuit board, then the cutters of all of the cut and clinch assemblies rotate to perform the cut and clinch operations. In this case, only a few of the cutters are effective for the one or two components added. Later, one or two additional components are added and the mechanism is again operated to cut and clinch the leads of the latter components. The assembly sequence is a matter of procedure and of a particular assembly line and whether a person or machine is adding the components.

Further, for some components only clinching may be desired such as for the tabs on transformers. For such components the vertical dimensions (from top to bottom of drawing) of the anvils 46 (FIGS. 4 and 5) and 100 (FIG. 7) anvils may be made shorter than illustrated while the vertical dimensions of the cutters may be made equal to or greater than the maximum projecting length of the leads or tabs below the printed circuit board. Then slots 64, 66 (FIG. 4) and 140 (FIG. 7) are not needed. With such anvils and cutters the leads are merely clinched and not cut. It will thus be realized that for either the arrangement of FIG. 1 or 6 some cut and clinch head assemblies and some clinch only assemblies may be utilized.

For the purposes of the claims, the phrase "processing assemblies" is understood to mean either or both clinching only or cutting and clinching assemblies and the word "processing" is understood to mean clinching or cutting and clinching depending on the type of processing assemblies utilized. The term "leads" also is intended to include tabs on transformers and other elements operated on by the lead processing assembly.

We claim:

1. A system for concurrently processing multiple leads of one or more components, said leads extending through a printed circuit board and projecting therefrom on the side opposite the components, comprising, in combination:

a support structure;

a plurality of component lead processing assemblies lying in a plane;

means secured to said support structure for aligning a printed circuit board relative to said lead processing assemblies;

each said assembly comprising an anvil mounted to said support structure and a lead processing means rotatable relative to said anvil and cooperating with said anvil for processing said projecting leads as said lead processing means is rotated relative to said anvil;

link means coupled to a plurality of said processing means and movable relative to said support structure in a direction parallel to said plane for concurrently rotating each said processing means;

said link means comprising a plate lying in a plane parallel to said plane and connecting means corresponding to each processing assembly coupled to said plate and each corresponding lead processing means; and drive means coupled to said plate for reciprocating said plate in directions parallel to said plane to concurrently rotate all said lead processing means a partial revolution in one rotational direction and then in the opposite rotational direction, whereby the leads of each said component are processed.

2. The system of claim 1 wherein said lead processing means comprises a cutter rotatable relative to said anvil and cooperating with said anvil for cutting leads of one said component and clinching the cut leads to said printed circuit board as said cutter is rotated relative to said anvil.

3. The system of claim 2 wherein said lead processing means comprises a lead bending means rotatable relative to said anvil and cooperating with said anvil for clinching multiple leads of one said component to said printed circuit board as said lead bending means is rotated relative to said anvil.

4. The combination of claim 2 wherein said link means further comprises a pinion secured to each said lead processing means and a rack secured to said plate and engaged with said pinion to rotate said pinion in response to movement of said plate and therefore rotate said cutter.

5. The combination as set forth in claim 1 wherein, for each said assembly, said link means comprises a lever arm parallel to said plane secured at one end to a corresponding lead processing means and at its other end slideably secured to a slotted guide secured to said plate for rotating said corresponding processing means as said plate is moved by said drive means.

6. The combination as set forth in claim 1 wherein said link means includes means for driving said processing means from a starting point in a first rotational direction to process said component leads and then driving said processing means in the opposite rotational direction back to said starting point.

7. A system for use with a printed circuit board which is capable of concurrently processing leads of one of more components mounted on said printed circuit board, said leads extending through and projecting beyond said printed circuit board, comprising, in combination:

a support structure including means lying in a plane for receiving a plurality of processing assemblies;

means secured to the support structure for aligning said printed circuit board to said receiving assemblies;

at least one processing assembly, said assembly comprising a fixed part secured to said support structure and a lead processing means rotatable relative to said fixed part and cooperating with said fixed part for processing said multiple leads of one of said components as said processing means is rotated relative to said fixed part;

link means coupled to each said processing means and movable in a direction parallel to said plane for concurrently rotating each said processing means in response to said parallel movement;

said link means comprising a plate lying in a plane parallel to said plane and connecting means coupled to said plate and each said lead processing means; and drive means coupled to said plate for reciprocating said plate in directions parallel to said plane to rotate each said processing means relative to its associated fixed part a partial revolution in one rotational direction and then in the opposite rotational direction to thereby process said leads.

8. The system of claim 7 wherein said lead processing means comprises a cutter part rotatable relative to said anvil and cooperating with said anvil for cutting leads of one said component and clinching the cut leads to said printed board as said cutter is rotated relative to said anvil.

9. The combination as set forth in claim 8 wherein said link means includes means for driving said cutter part from a starting point in a first rotational direction to cut and clinch said component leads and then driving said cutter part in the opposite rotational direction back to said starting point.

10. A cut and clinch apparatus for cutting and clinching the leads of components on a printed circuit board comprising:

first support means fixed in place;

a plurality X of second support means adjustably secured to said first support means, said first and second support means including means for adjustably securing each said second means in a given direction at a corresponding selected one of X different locations respectively in a first linear range relative to the first support means;

a plurality of lead cut and clinch assembly means for cutting the leads of said components and clinching the cut leads against said board, each of said second support means including means for securing at least one of said cut and clinch assembly means at a selected one of Y different locations in a second direction normal to the given direction in a second linear range; and actuating means coupled to said support means for simultaneously operating said plurality of cut and clinch assembly means regardless their selected X, Y positions in said first and second ranges.

11. The apparatus of claim 10 further including alignment means secured to said first support means for aligning said printed circuit board to said assembly means.

12. A system for concurrently processing multiple leads of one or more components, said leads extending through a printed circuit board and projecting therefrom on the side opposite the components, comprising in combination:

a plurality of component lead processing assemblies lying in a plane;

a support structure comprising a first pair of spaced apart rails and at least one secondary support structure and means for removably securing each said secondary support structure to said rails at any point along said rails, said secondary support structure including means for receiving a plurality of said processing assemblies;

means secured to the support structure for aligning a printed circuit board relative to said lead processing assemblies;

each said assembly comprising an anvil mounted to said support structure and a lead processing means rotatable relative to said anvil and cooperating with said anvil for processing said projecting leads as said lead processing means is rotated relative to said anvil;

link means coupled to a plurality of said processing means and movable relative to said support structure in a direction parallel to said plane for rotating each said processing means; and drive means coupled to said link means to concurrently rotate said processing means, whereby the leads of each said component are processed.

13. The combination as set forth in claim 12 wherein each said secondary support structure includes an elongated slot for receiving a plurality of processing assemblies at any desired point along said slot.

14. The combination as set forth in claim 13 wherein said secondary support structure further includes splines along opposed edges of said slot and wherein each said anvil is cylindrical and includes splines about its circumference which mate with said splines in said slot to angularly orient said anvil relative to said secondary support structure.

15. The combination as set forth in claim 12 wherein said link means comprises a pinion secured to each said lead processing means and wherein each said secondary support structure further includes a rack slidable along that secondary support structure and arranged to engage all said pinions on that secondary support structure and means coupled to said racks of said secondary support structures and said drive means for moving said racks in one direction to rotate said processing means to process said leads and to then move said racks in the opposite direction to return said processing means to the original position.

16. The combination as set forth in claim 15 wherein said means coupled to said racks and said drive means comprises an additional rack coupled to and responsive to said drive means and means coupling said additional rack to said slidable rack of each said secondary support structure for moving said slidable racks in response to the movement of said additional rack.

17. A system for concurrently processing multiple leads of one or more components, said leads extending through a printed circuit board and projecting therefrom on the side opposite the components, comprising, in combination:

a support structure;

a plurality of component lead processing assemblies lying in a plane;

means secured to the support structure for aligning a printed circuit board relative to said lead processing assemblies;

each said assembly comprising an anvil mounted to said support structure and a lead processing means rotatable relative to said anvil and cooperating with said anvil for processing said projecting leads as said lead processing means is rotated relative to said anvil;

a single link member coupled to said plurality of said processing means and movable relative to said support structure in a direction parallel to said plane for concurrently rotating each said processing means; and drive means coupled to said link member for moving said link member relative to said support structure in said parallel direction to concurrently rotate said processing means whereby the leads of each said component are processed.

18. A system for use with a printed circuit board which system is capable of concurrently processing leads of one of more components mounted on said printed circuit board, said leads extending through and projecting beyond said printed circuit board, comprising, in combination:

a support structure including means lying in a plane for receiving a plurality of processing assemblies;

means secured to the support structure for aligning said printed circuit board to said receiving assemblies;

at least one processing assembly, said assembly comprising a fixed anvil part secured to said support structure and a lead processing means rotatable relative to said fixed part and cooperating with said fixed part for processing said multiple leads of one of said components as processing means is rotated relative to said fixed part;

a single link member coupled to said processing means and movable in a direction parallel to said plane for concurrently rotating each said processing means in response to said parallel movement; and drive means coupled to said link member for moving said link member in said parallel direction to rotate each said processing means relative to its associated fixed part to thereby process said leads.

* * * * *